United States Patent

Kawai et al.

Patent Number: 6,064,082
Date of Patent: May 16, 2000

[54] HETEROJUNCTION FIELD EFFECT TRANSISTOR

[75] Inventors: Hiroji Kawai; Shunji Imanaga; Toshimasa Kobayashi, all of Kanagawa, Japan

[73] Assignee: Sony Corporation, Tokyo, Japan

[21] Appl. No.: 09/086,988

[22] Filed: May 29, 1998

[30] Foreign Application Priority Data

May 30, 1997 [JP] Japan .................. P09-142221

[51] Int. Cl.[7] .................. H01L 31/0328; H01L 31/0336; H01L 31/072; H01L 31/109; H01L 35/26
[52] U.S. Cl. ............................. 257/192; 257/191
[58] Field of Search ................... 257/192, 191

[56] References Cited

U.S. PATENT DOCUMENTS 4,961,194 10/1990 Kuroda et al. .
5,373,168 12/1994 Ando et al. .
5,780,879 7/1998 Unozawa .

Primary Examiner—Stephen D. Meier
Attorney, Agent, or Firm—Hill & Simpson

[57] ABSTRACT

A heterojunction field effect transistor realizing a high performance by a significant decrease in source resistance while maintaining a sufficiently high gate resistivity to voltage is provided. Sequentially stacked on a c-face sapphire substrate via a buffer layer are an undoped GaN layer, undoped $Al_{0.3}Ga_{0.7}N$ layer, undoped GaN channel layer, undoped $Al_{0.15}Ga_{0.85}N$ spacer layer, n-type $Al_{0.15}Ga_{0.85}N$ electron supply layer, graded undoped $Al_zGa_{1-z}N$ barrier layer and n-type $Al_{0.06}Ga_{0.94}N$ contact layer, and a gate electrode, source electrode and drain electrode are formed on the n-type $Al_{0.06}Ga_{0.94}N$ contact layer to form a AlGaN/GaN HEMT. The Al composition z in the graded undoped $Al_zGa_{1-z}N$ barrier layer continuously decreases from 0.15 to 0.06, for example, from the n-type $Al_{0.15}Ga_{0.85}N$ electron supply layer toward the n-type $Al_{0.06}Ga_{0.94}N$ contact layer. An $n^{++}$-type GaN contact layer may be formed on the n-type $Al_{0.06}Ga_{0.94}N$ contact layer in the region for the source electrode and the drain electrode, and the source electrode and the drain may be formed on it.

9 Claims, 8 Drawing Sheets

HETEROJUNCTION FIELD EFFECT TRANSISTOR

BACKGROUND OF THE INVENTION

1. Field of the Invention

This invention relates to a heterojunction field effect transistor, and it is especially suitable for use in a heterojunction field effect transistor using nitride-based III–V compound semiconductors such as GaN.

2. Description of the Related Art

Nitride-based III–V compound semiconductors including GaN as their major component (hereinafter called "GaN semiconductors") are direct transitional semiconductors having energy gaps (band gaps) $E_g$ ranging from 1.9 eV to 6.2 eV and theoretically enabling realization of light emitting devices capable of emitting light ranging from visible ranges to ultraviolet ranges. Therefore, semiconductor light emitting devices using GaN semiconductors are now being under active developments. GaN semiconductors also have a great possibility as materials of electron moving devices. That is, the saturation electron velocity of GaN is as large as about $2 \times 10^7$ cm/s, which is larger than that of Si, GaAs or SiC, and its breakdown electric field is as large as $5 \times 10^6$ V/cm, which is next to that of diamond. For these reasons, GaN semiconductors have been expected to be hopeful as materials of high-frequency, high-power semiconductor devices.

Because of the difficulty of making p-type layers with a high carrier concentration, no bipolar transistor as an electron moving device using GaN semiconductors has been made, and there are only field effect transistors (FET) on an experimental basis till now. FET using GaN semiconductors has three serious handicaps as compared with FET using GaAs semiconductors. The first one is the difficulty in making the conduction layer by ion implantation or diffusion of an impurity, the second is the difficulty of making an alloy with a metal, and the third is that etching relies on reactive ion etching (RIE) or its similar process, and no gate recess technology with a high accuracy has been developed. Therefore, developments of GaN FETs made heretofore have been within these restrictions.

Shown in FIG. 1 is a conventional AlGaN/GaN heterojunction FET (Appl. Phys. Lett. 65(9), 1121(1994)). As shown in FIG. 1, the AlGaN/GaN heterojunction FET has formed an n-type GaN channel layer 102 as an electron moving layer and an n-type $Al_{0.13}Ga_{0.87}$ electron supply layer 103 on a sapphire substrate 101. The n-type GaN channel layer 102 is 0.6 μm thick, and the n-type $Al_{0.13}Ga_{0.87}N$ electron supply layer 103 is 25 nm thick. The n-type $Al_{0.13}Ga_{0.87}N$ electron supply layer 103 is patterned in a predetermined configuration, probably by non-selective etching by RIE. A gate electrode 104 is formed on the n-type $Al_{0.13}Ga_{0.87}N$ electron supply layer 103, and a source electrode 105 and a drain electrode 106 are formed on the n-type GaN channel layer 102 in contact with opposite side walls of the n-type $Al_{0.13}Ga_{0.87}N$ electron supply layer 103. The gate electrode 104 is in Schottky contact with the n-type $Al_{0.13}Ga_{0.87}N$ electron supply layer 103, and the source electrode 105 and the drain electrode 106 are in ohmic contact with the n-type GaN channel layer 102. Thus, the AlGaN/GaN heterojunction FET has a structure similar to a high electron mobility transistor (HEMT), but is different from normal HEMT in using the n-type GaN channel layer 102 in lieu of an intrinsic GaN layer as the electron moving layer.

In the conventional AlGaN/GaN heterojunction FET shown in FIG. 1, the n-type $Al_{0.13}Ga_{0.87}N$ layer 103 must be patterned by non-selective etching to bring the source electrode 105 and the drain electrode 106 into direct contact with the n-type GaN channel layer 102 relatively good in ohmic contact. Therefore, the n-type GaN channel layer 103 must be as thick as 0.6 μm, and this is a major reason of degradation of the performance of the FET itself.

FIG. 2 shows another conventional AlGaN/GaN heterojunction FET (Appl. Phys. Lett. 69(6), 794(1996)). As shown in FIG. 2, the AlGaN/GaN heterojunction FET includes an intrinsic GaN layer 202, n-type GaN channel layer 203 as an electron moving layer, undoped $Al_{0.15}Ga_{0.85}N$ spacer layer 204, and n-type $Al_{0.15}Ga_{0.85}N$ electron supply layer 205 sequentially stacked on a sapphire substrate 201. The intrinsic GaN layer 202 is 1 μm thick, n-type GaN channel layer 203 is 0.1 μm thick, undoped $Al_{0.15}Ga_{0.85}N$ spacer layer 204 is 3 nm thick, and n-type $Al_{0.15}Ga_{0.855}N$ electron supply layer 205 is 30 nm thick. Formed on the n-type $Al_{0.15}Ga_{0.85}N$ electron supply layer 205 are a gate electrode 206, source electrode 207 and drain electrode 208. The gate electrode 206 is in Schottky contact with the n-type $Al_{0.15}Ga_{0.85}N$ electron supply layer 205, and the source electrode 207 and the drain electrode 208 are in ohmic contact with the n-type $Al_{0.15}Ga_{0.85}N$ electron supply layer 205.

Also in the conventional AlGaN/GaN heterojunction FET shown in FIG. 2, the thickness of the n-type GaN channel layer 203 as thick as 0.1 μm causes degradation of the performance of the FET itself.

FIG. 3 shows a conventional AlGaN/GaN HEMT having a thinner electron moving layer for a higher performance (Appl. Phys. Lett. 68(20), 2849(1996)). As shown in FIG. 3, the AlGaN/GaN HEMT includes an AlN buffer layer 302, undoped GaN layer 303, undoped $Al_{0.16}Ga_{0.84}N$ layer 304, undoped GaN channel layer 305 as an electron moving layer, undoped $Al_{0.16}Ga_{0.84}N$ spacer layer 306, n-type $Al_{0.16}Ga_{0.84}N$ electron supply layer 307, undoped $Al_{0.16}Ga_{0.84}N$ barrier layer 308 and n-type $Al_{0.06}Ga_{0.94}N$ contact layer 309 sequentially stacked on a sapphire substrate 301. The undoped GaN layer 303 is 3 to 5 μm thick, undoped $Al_{0.16}Ga_{0.84}N$ layer 304 is 20 nm thick, undoped GaN channel layer 305 is 7.5 nm thick, undoped $Al_{0.16}Ga_{0.84}N$ spacer layer 306 is 5 nm thick, n-type $Al_{0.16}Ga_{0.84}N$ electron supply layer 307 is 2 nm thick, undoped $Al_{0.16}Ga_{0.4}N$ barrier layer 308 is 13 nm thick, and n-type $Al_{0.06}Ga_{0.94}N$ contact layer 309 is 6 nm thick. Formed on the n-type $Al_{0.06}Ga_{0.94}N$ contact layer 309 are a gate electrode 310, source electrode 311 and drain electrode 312. The gate electrode 310 is in Schottky contact with the n-type $Al_{0.06}Ga_{0.94}N$ contact layer 309, and the source electrode 311 and the drain electrode 312 are in ohmic contact with the n-type $Al_{0.06}Ga_{0.94}N$ contact layer 309. The gate electrode 310 is made of a Ti/Pd/Au film, and the source electrode 311 and the drain electrode 312 are made of Ni/AuSi/Ag/Au films.

In the conventional AlGaN/GaN HEMT shown in FIG. 3, the thickness of the undoped GaN channel layer 305 as the electron moving layer is as thin as 7.5 nm. However, since the source electrode 311 and the drain electrode 312 are formed on the n-type $Al_{0.06}Ga_{0.94}N$ contact layer 309, good ohmic contact is not obtained. Therefore, the source resistance is high, and the essential performance of AlGaN/GaN HEMT could not be obtained. In general, the transconductance $g_m$, which is one of indices of the performance of FET, is $g_m = g_{mi}/(1 + R_s g_{mi})$, where $R_s$ is the source resistance, and $g_{mi}$ is the intrinsic transconductance (transconductance when $R_s = 0$). This equation shows that, with a large $R_s$, $g_m$ becomes small as compared with $g_{mi}$, and an acceptably large current driving power cannot be obtained.

To improve the ohmic contact of the source electrode 311 and the drain electrode 312, it would be a possible approach to alloy the source electrode 311 and the drain electrode 312 with the n-type $Al_{0.06}Ga_{0.94}N$ contact layer 309. However, AlGaN is very hard, and has a high melting point (the melting point of AlN is 3000° C., and the melting point of GaN is higher than 1700° C.). Therefore, AlGaN is not solid-soluble with metals, and it is extremely difficult to obtain a low-resistance ohmic contact by alloying.

SUMMARY OF THE INVENTION

It is therefore an object of the invention to provide a heterojunction field effect transistor with a high performance by significantly reducing the source resistance while maintaining a sufficiently high gate resistivity to voltage.

According to the invention, there is provided a heterojunction field effect transistor comprising an electron moving layer; an electron supply layer on the electron moving layer; a barrier layer on the electron supply layer; and a contact layer on the barrier layer, the bottom energy of the conduction band of the barrier layer immediately under the source electrode being decreased continuously from the electron supply layer toward the contact layer.

The source electrode and the drain electrode are formed on the contact layer. The gate electrode need not be necessarily formed on the contact layer, but may be formed on the contact layer together with the source electrode and the drain electrode.

Typically, the bottom energy of the conduction band of the barrier layer is substantially equal to the bottom energy of the conduction band of the contact layer along the interface between the barrier layer and the contact layer. In this case, the offset $\Delta E_c$ of the conduction bands along the interface between the barrier layer and the contact layer just under the source electrode is approximately 0. In order to continuously decrease the bottom energy of the conduction band of the barrier layer from the electron supply layer toward the contact layer, the composition of the barrier layer is changed continuously from the electron supply layer toward the contact layer. In a typical version of the invention, the energy gap of the barrier layer just under the source electrode continuously decreases from the electron supply layer toward the contact layer. The energy gap of the electron supply layer is normally larger than the energy gap of the electron moving layer.

In a typical version of the invention, the barrier layer is undoped, and the contact layer is an n-type.

Typically, the electron moving layer, electron supply layer, barrier layer, contact layer, and so forth, are made of nitride III–VI compound semiconductors. Nitride III–V compound semiconductors contain at least Ga and N, and may additionally contain one or more group III elements selected from the group consisting of Al, In and B, and/or one or more group V elements selected from the group consisting of As and P. More specifically, the electron moving layer is made of $Ga_{1-x}In_xN$ (where $0 \leq x \leq 1$), the electron supply layer is made of $Al_yGa_{1-y}N$ (where $0 \leq y \leq 1$), the barrier layer is made of $Al_zGa_{1-z}N$, and the contact layer is made of n-type $Al_uGa_{1-u}N$ (where $0 \leq u \leq 0.1$) or n-type $Al_{1-v}Ga_vN$ (where $0 \leq v \leq 1$).

In this case, the Al composition z in $Al_zGa_{1-z}N$ forming the barrier layer is preferably decreased continuously from y to u starting from the electron supply layer toward the contact layer. The Al composition z in $Al_zGa_{1-z}N$ forming the barrier layer is preferably not larger than 0.1 along the interface between the barrier layer and the contact layer.

According to the invention having the above-summarized construction, since the bottom energy of the conduction band of the barrier layer just under the source electrode continuously decreases from the electron supply layer toward the contact layer, the offset $\Delta E_c$ between the conduction bands of the barrier layer and the contact layer along the interface thereof can be made sufficiently small, and the barrier for electrons by the offset $\Delta E_c$ can be made sufficiently small.

The above, and other, objects, features and advantage of the present invention will become readily apparent from the following detailed description thereof which is to be read in connection with the accompanying drawings.

DESCRIPTION OF THE PREFERRED EMBODIMENTS

According to the metal-semiconductor contact theory, if a semiconductor has a sufficiently high electron concentration, ohmic contact of an electrode with the semiconductor under a low contact resistance is possible even when they are not alloyed. From the viewpoint, a review is made on the conventional AlGaN/GaN HEMT shown in FIG. 3. Since the n-type $Al_{0.06}Ga_{0.94}N$ contact layer 309 with which the source electrode 311 and the drain electrode 312 contact is in contact also with the gate electrode 310, its electron concentration is limited within a range assuring an effective Schottky barrier being made between the gate electrode 310 and the n-type $Al_{0.06}Ga_{0.94}N$ contact layer 309. Such an electron concentration is an insufficient value for making an ohmic contact, and makes the contact resistance high.

Figure 1:
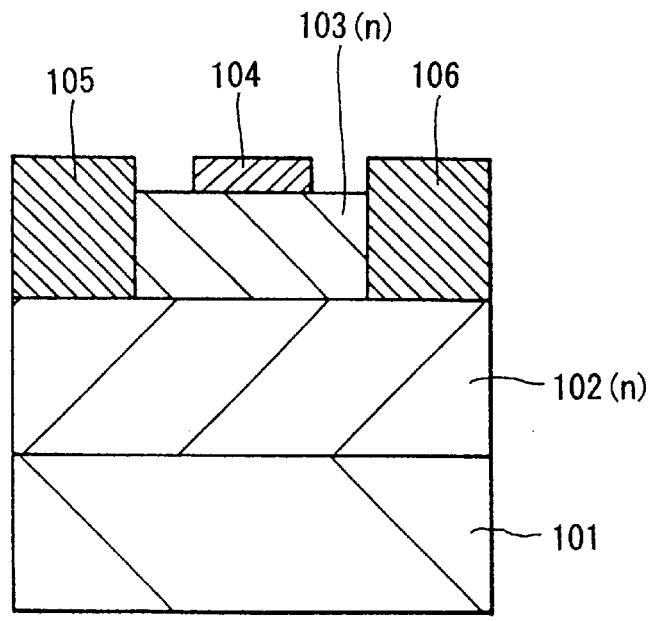
FIG. 1 is a cross-sectional view of an existing AlGaN/GaN heterojunction FET.
Figure 2:
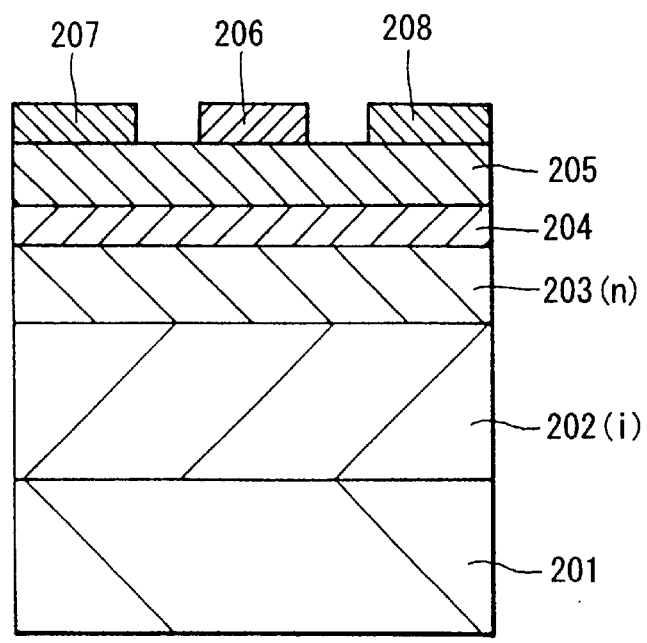
FIG. 2 is a cross-sectional view of another existing AlGaN/GaN heterojunction FET.
Figure 3:
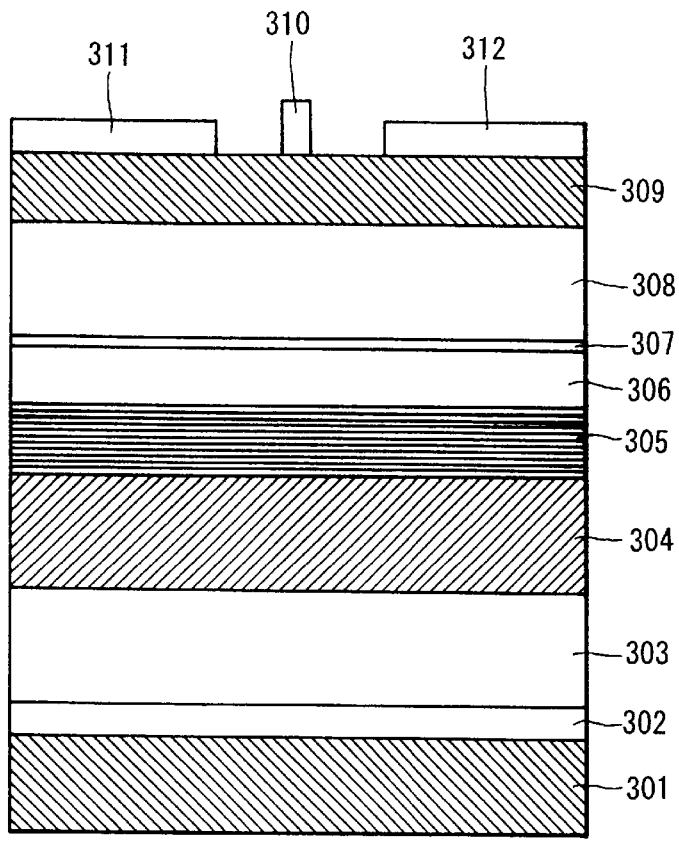
FIG. 3 is a cross-sectional diagram of an existing AlGaN/GaN HEMT.

One of reasons which discourage engineers in employing an $n^{++}$-type GaN layer with a higher carrier concentration as the contact layer for the source electrode and the drain electrode in either the AlGaN/GaN heterojunction FET shown in FIG. 2 or the AlGaN/GaN HEMT shown in FIG. 3 lies in that there is no technology for precisely removing the $n^{++}$-type GaN layer alone from the gate electrode site, while leaving the underlying AlGaN layer, after the $n^{++}$-type GaN layer is grown overall. The second reason is that a metal for making the source electrode cannot reach the electron moving layer by alloying the source electrode and the drain electrode, which results in leaving the AlGaN barrier layer between the electron moving layer and in leaving a high source resistance, although the contact resistance of the source electrode may be small. In the AlGaN/GaN heterojunction FET shown in FIG. 1, although the source electrode 105 and the drain electrode 106 contact the n-type GaN channel layer 102, the n-type GaN channel layer 102 does not have a higher carrier concentration and makes a barrier against electrons between these source and drain electrodes 105, 106 and the n-type GaN channel layer 102.

Figure 4:
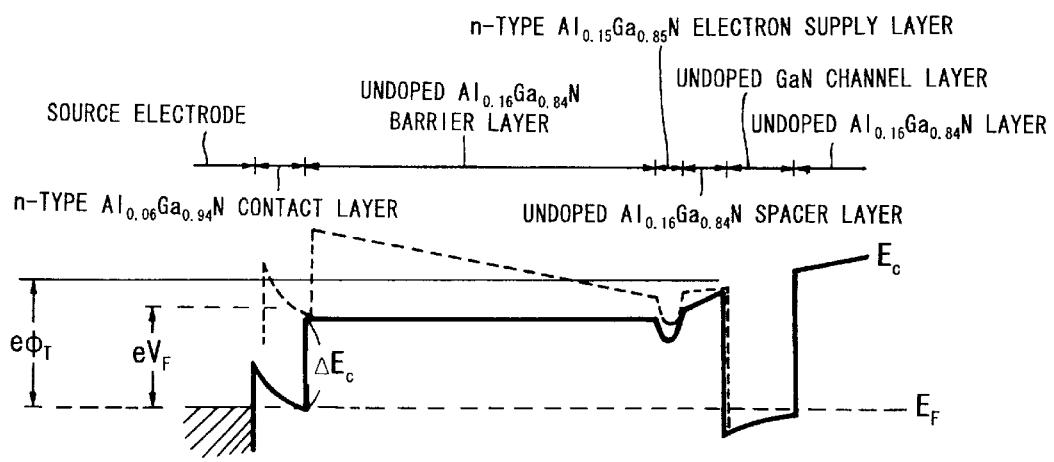
FIG. 4 is an energy band diagram directly under the source electrode in the AlGaN/GaN HEMT shown in FIG. 3.

FIG. 4 is an energy band diagram, especially showing the conduction band, directly under the source electrode in the AlGaN/GaN HEMT shown in FIG. 3. In FIG. 4, $E_F$ is the Fermi level, $E_C$ is the bottom energy of the conduction band (also in the subsequent figures). As shown in FIG. 4, in the AlGaN/GaN HEMT, an undoped $Al_{0.16}Ga_{0.84}N$ barrier layer 308 having a large energy gap $E_g$ exists between the source electrode 311 and the undoped GaN channel layer 305, and there is an offset $\Delta E_c$ in conduction bands along the heterointerface between the undoped $Al_{0.16}Ga_{0.84}N$ barrier layer 308 and the n-type $Al_{0.06}Ga_{0.94}N$ contact layer 309. The barrier height for electrons by the offset $\Delta E_c$ is approximately 0.15 eV, which is larger than the thermal energy 0.025 eV at the room temperature, and disturbs movement of electrons from the source electrode 11 to the undoped GaN channel layer 305, i.e. the current flowing from the undoped GaN channel layer 305 to the source electrode 311. Therefore, it is important to remove the barrier against electrons.

Figure 5:
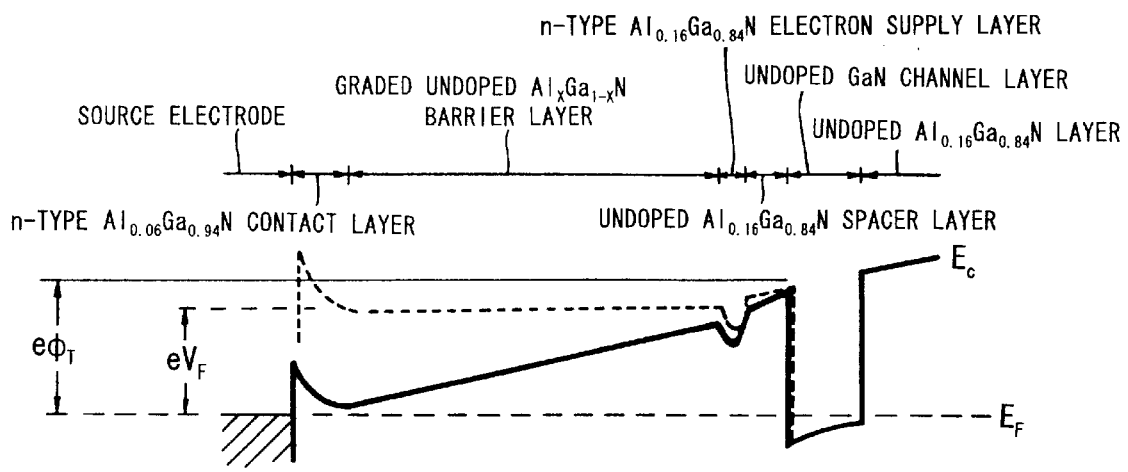
FIG. 5 is an energy band diagram for explaining the principle of the invention.
Figure 6:
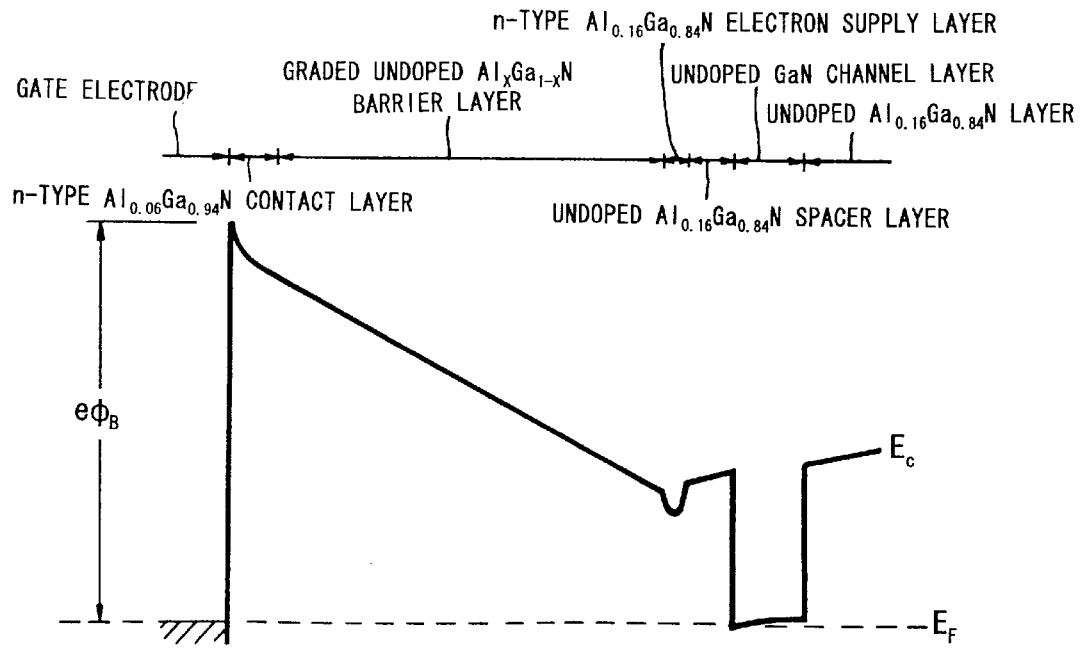
FIG. 6 is an energy band diagram for explaining the principle of the invention.

The Inventor has found through his active researches that, to remove the barrier against electrons due to the offset $\Delta E_c$ in conduction band along the heterointerface between the n-type $Al_{0.06}Ga_{0.94}N$ contact layer 309 and the undoped $Al_{0.16}Ga_{0.84}N$ barrier layer 308, it is effective to replace the undoped $Al_{0.16}Ga_{0.84}N$ barrier layer 308 with a graded undoped $Al_zGa_{1-z}N$ layer in which the Al composition z continuously decreases from the n-type $Al_{0.16}Ga_{0.84}N$ electron supply layer 307 toward the n-type $Al_{0.06}Ga_{0.94}N$ contact layer 309. The aspect of the conduction bands directly under the source electrode 311 is shown in FIG. 5. As shown in FIG. 5, the offset $\Delta E_c$ in conduction band along the heterointerface between the graded undoped $Al_zGa_{1-z}N$ layer and the n-type $Al_{0.06}Ga_{0.94}N$ contact layer 309 is zero. In this case, the conduction band immediately under the gate electrode 310 is as shown in FIG. 6. As shown in FIG. 6, as far as the work function of the metal forming the gate electrode 310 is sufficiently large and the carrier concentration and the thickness of the n-type $Al_{0.06}Ga_{0.94}N$ contact layer 309 are not large, a sufficiently high Schottky barrier $e\phi_B$ is obtained, and it functions as a gate Schottky barrier.

Figure 7:
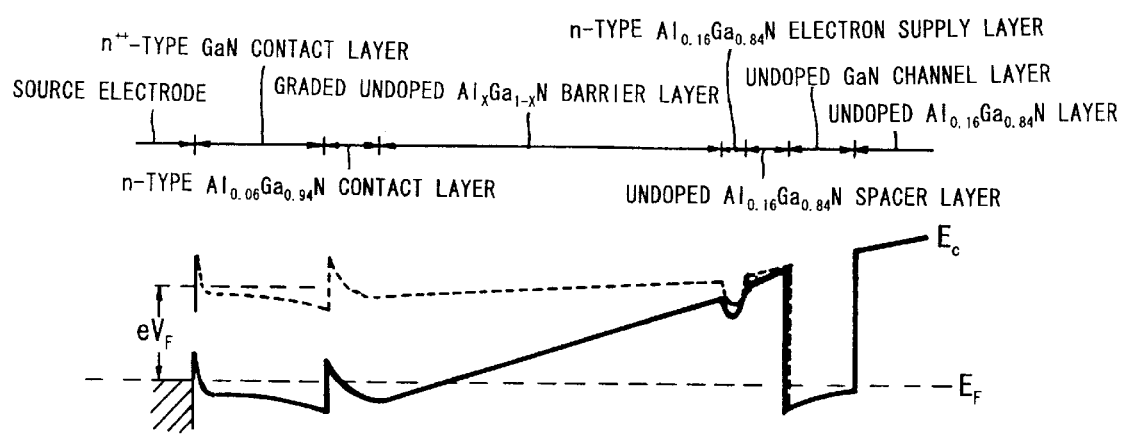
FIG. 7 is an energy band diagram for explaining the principle of the invention.

When an $n^{++}$-type GaN layer with a sufficiently high carrier concentration is stacked as a second contact layer on the n-type $Al_{0.06}Ga_{0.94}N$ contact layer 309 and the source electrode 311 is formed on it in contact therewith, the conduction band appears as shown in FIG. 7, in which the height of the barrier against electrons immediately under the source electrode 311 further decreases.

A review is made to know operational differences between the AlGaN/GaN HEMT shown in FIG. 3 and the AlGaN/GaN HEMT using the undoped graded $Al_zGa_{1-z}N$ layer in lieu of the undoped $Al_{0.16}Ga_{0.84}N$ barrier layer 308 in the AlGaN/GaN HEMT in FIG. 3. In the AlGaN/GaN HEMT shown in FIG. 3, the barrier $e\phi_T$ against electrons of the source electrode 311 is the energy difference between $E_F$ and the summit of the bottom of the conduction band of the undoped $Al_{0.16}Ga_{0.84}N$ spacer layer 306. When a voltage $V_f$ is applied across the source electrode and the electron moving layer, the whole barrier $e\phi_T$ does not decrease. This is the same condition as that resulting from Schottky reverse biasing, and the source resistance is presumably high. In contrast, in the AlGaN/GaN HEMT shown in FIG. 5 using the undoped graded $Al_zGa_{1-z}N$ layer instead of the undoped $Al_{0.16}Ga_{0.84}N$ barrier layer 308, the barrier $e\phi_T$ against electrons decreases with increase of the applied voltage $V_f$, and only a small barrier existing along the interface between the source electrode 311 and the n-type $Al_{0.06}Ga_{0.94}N$ contact layer 309 finally remains. The voltage applied mode is the same as that resulting from Schottky forward biasing.

If the $n^{++}$-type GaN layer is interposed between the n-type $Al_{0.06}Ga_{0.94}N$ contact layer 309 and the source electrode 311, then the barrier existing along the interface between the source electrode 311 and the n-type $Al_{0.06}Ga_{0.94}N$ contact layer 309 substantially disappears, and a fully Schottky forward biased mode is realized.

In order to ensure the $n^{++}$-type GaN layer with a high carrier concentration to lie only in the source electrode portion, the $n^{++}$-type GaN layer alone must be selectively removed by etching only from the site for the gate electrode 310. For the etching process made here, the etching technology proposed by the Applicant in Japanese Patent Application No. Hei 9-66536, which is not a prior art of the present application, can be used. The etching technology can remove GaN alone, while maintaining AlGaN non-etched, by using a mixed gas containing HCl and $N_2$ as the etching gas and by thermochemically etching it under a high temperature of 700 to 800° C.

In the AlGaN/GaN HEMT shown in FIG. 3, the n-type $Al_{0.06}Ga_{0.94}N$ contact layer 209 is used as the contact layer. Next made is a consideration whether or how much the Al composition of the n-type AlGaN layer as the contact layer. The electron affinity of AlGaN becomes smaller as the Al composition increases. Therefore, the Schottky barrier between AlGaN and a metal increases with increase in Al composition. From the viewpoint of obtaining a sufficiently high gate Schottky barrier, the Al composition in AlGaN had better be large. That is, the gate electrode had better be made on the n-type AlGaN layer whose Al composition is as high as 0.15 like that in the AlGaN/GaN heterojunction FET shown in FIG. 2. This approach, however, results in increasing the height of the barrier immediately under the source electrode, and is not desirable from the viewpoint of reducing the source resistance. Practically, if Pt is used as a main source material of the gate electrode 310, the Schottky barrier is 1.1 eV when Pt contacts with GaN, and the value is considered to satisfy the requirement for a gate Schottky barrier. Thus, a small Al composition is desirable here, mainly aiming at reduction of the source resistance. Theoretically, the Al composition in the n-type AlGaN layer as the contact layer is preferably not larger than 0.1 in order to limit the barrier height directly under the source electrode within 0.15 eV. It is also possible to decrease the Al composition to zero, namely, to use an n-type GaN contact layer, as far as its thickness and carrier concentration are not large.

Although consideration has been made on AlGaN/GaN HEMT, the same is applied to other HEMT using other semiconductors which are not readily alloyed with metals and are difficult to make good ohmic contact with metals by alloying, like GaN semiconductors.

Some embodiments of the invention are explained below in detail with reference to the drawings. In all figures illustrating embodiments, the same or equivalent elements are labeled with common reference numerals.

Figure 8:
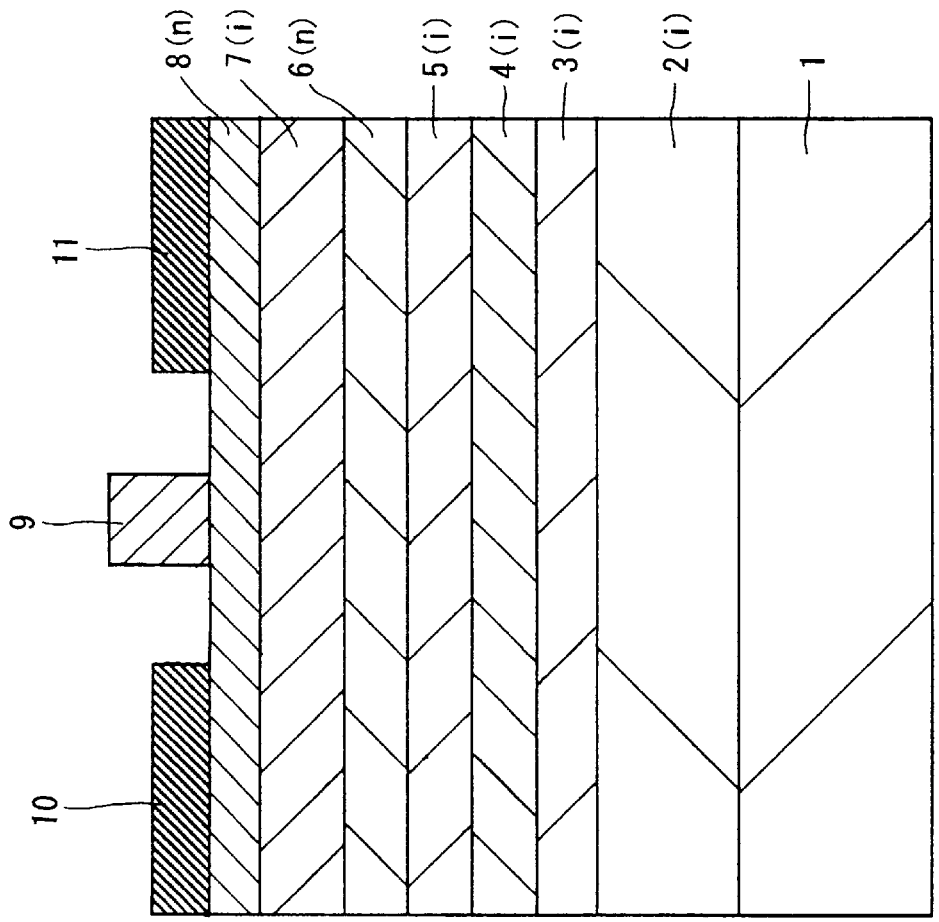
FIG. 8 is a cross-sectional view of an AlGaN/GaN HEMT according to a first embodiment of the invention.

FIG. 8 shows an AlGaN/GaN HEMT according to the first embodiment of the invention. The conduction band directly under the source electrode and the conduction band directly under the gate electrode in the AlGaN/GaN HEMT are the same as those shown in FIG. 5 and FIG. 6.

As shown in FIG. 8, in the AlGaN/GaN HEMT according to the first embodiment, sequentially stacked on a c-face sapphire substrate 1 via an AlN or GaN buffer layer (not shown) made by low temperature growth are an undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6 doped with Si, for example, as the n-type impurity, graded undoped $Al_zGa_{1-z}N$ barrier layer 7, and n-type $Al_{0.06}Ga_{0.94}N$ contact layer 8 doped with Si, for example, as the n-type impurity. In an example of thicknesses of respective layers, the buffer layer is 30 nm thick, undoped GaN layer is 2 $\mu$m thick, undoped $Al_{0.3}Ga_{0.7}N$ layer 3 is 30 nm thick, undoped GaN channel layer 4 is 10 nm thick, undoped $Al_{0.15}Ga_{0.85}N$ spacer layer 5 is 10 nm thick, n-type $A_{0.15}Ga_{0.85}N$ electron supply layer 6 is 10 nm thick, graded undoped $Al_zGa_{1-z}N$ barrier layer 7 is 15 nm thick, and n-type $Al_{0.06}Ga_{0.94}N$ contact layer 8 is 6 nm thick. Carrier concentrations of the n-type $Al_{0.15}Ga_{0.85}N$ electron supply layer 6 and the n-type $Al_{0.06}Ga_{0.94}N$ contact layer 8 may be, for example, $2 \times 10^{19} cm^{-3}$.

Formed on the n-type $Al_{0.06}Ga_{0.94}N$ contact layer 8 are a gate electrode 9, source electrode 10 and drain electrode 11. The gate electrode 9 is in Schottky contact with the n-type $Al_{0.06}Ga_{0.94}N$ contact layer 8, and the source electrode 10 and the drain electrode 11 are in ohmic contact with the n-type $Al_{0.06}Ga_{0.94}N$ contact layer 8.

The Al composition Z in the graded undoped $Al_zGa_{1-z}N$ barrier layer 7 decreases continuously linearly from 0.15 along the interface between the graded undoped $Al_zGa_{1-z}N$ barrier layer 7 and the n-type $Al_{0.15}Ga_{0.85}N$ electron supply layer 6 to 0.06 along the interface between the graded undoped $Al_zGa_{1-z}N$ barrier layer 7 and the n-type $Al_{0.06}Ga_{0.94}N$ contact layer 8. Then, the bottom energy $E_c$ of the conduction band of the graded undoped $Al_zGa_{1-z}N$ barrier layer 7 decreases continuously linearly from the n-type $Al_{0.15}Ga_{0.85}N$ electron supply layer 6 toward the n-type $Al_{0.06}Ga_{0.94}N$ contact layer 8, and, at the heterointerface between the graded undoped $Al_zGa_{1-z}N$ barrier layer 7 and the n-type $Al_{0.06}Ga_{0.94}N$ contact layer 8, it is equal to the bottom energy $E_c$ of the conduction band of the n-type $Al_{0.06}Ga_{0.94}N$ contact layer 8. Therefore, there is no offset $\Delta E_c$ along the heterointerface between the graded undoped $Al_zGa_{1-z}N$ barrier layer 7 and the n-type $Al_{0.06}Ga_{0.94}N$ contact layer 8, and there is no barrier against electrons by the offset $\Delta E_c$. In this case, the only barrier that appears just under the source electrode 10 is a small notch-shaped barrier as low as approximately 0.1 eV or less which may theoretically exist along the interface between the source electrode 10 and the n-type $Al_{0.06}Ga_{0.94}N$ contact layer 8. At that time, since the flow of electrons just under the source electrode 10 is equivalent to the flow which will occur when a forward bias is applied to a diode, except for the resistance by the small barrier as low as approximately 0.1 eV or less, the resistance is very low. On the other hand, as shown in FIG. 6, a sufficiently high Schottky barrier $e\phi_B$ is formed in the conduction band directly under the gate electrode 10.

Next explained is a method for manufacturing the AlGaN/GaN HEMT according to the embodiment having the above-explained construction.

With reference to FIG. 8, the c-face sapphire substrate 1 is first set in a reaction tube of a metal organic chemical vapor deposition (MOCVD) apparatus for example, and heated to 1050° C., for example, in hydrogen ($H_2$) atmosphere to clean its surface. Thereafter, the substrate temperature is decreased to 530° C., for example, and a buffer layer (not shown) made of AlN or GaN is grown at the temperature. The substrate temperature is then increased to and maintained at 1000° C., for example, while supplying a flow of ammonium ($NH_3$) gas, to sequentially grow on the buffer layer the undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6, graded undoped $Al_zGa_{1-z}N$ barrier layer 7 and n-type $Al_{0.06}Ga_{0.94}N$ contact layer 8. Source material gases used for growth of these GaN semiconductor layers may be, for example, trimethyl gallium (TMG) as the source material of Ga, trimethyl aluminum (TMA) as the source material of Al, and $NH_3$ as the source material of N, and silane ($SiH_4$) is used as the dopant of Si, which is an n-type impurity. The carrier gas may be $H_2$, for example. While the graded undoped $Al_zGa_{1-z}N$ barrier layer 7 is grown, the ratio of the supply amount of the Al source material to the supply amount of the Ga source material is gradually decreased.

A resist pattern (not shown) of a predetermined configuration is next made on the n-type $Al_{0.06}Ga_{0.94}N$ contact layer 8 by lithography. Using the resist pattern as a mask, the layers are etched by RIE, for example, to the depth involving an upper-lying part of the undoped GaN layer 2, namely, by 0.1 $\mu$m thick, for example, to pattern the upper-lying part of the undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6, undoped graded $Al_zGa_{1-z}N$ barrier layer 7 and n-type $Al_{0.06}Ga_{0.94}N$ contact layer 8 into a mesa-type configuration for isolation.

After that, another resist pattern (not shown) of a predetermined configuration for making the source electrode and the drain electrode is made on the n-type $Al_{0.06}Ga_{0.94}N$ contact layer 8 by lithography. Subsequently, a Ti/Al/Au film (not shown), for example, is formed on the entire surface by vacuum evaporation, for example. The resist pattern is thereafter removed together with the overlying Ti/Al/Au film by lift-off. As a result, the source electrode 10 and the drain electrode 11 are formed on the n-type $Al_{0.06}Ga_{0.94}N$ contact layer 8. After that, the product is annealed using, for example, $N_2$ atmosphere, 850° C., for five minutes, for example, to decrease the contact resistance of the source electrode 10 and the drain electrodes 11.

Another resist pattern (not shown) having a predetermined configuration for making the gate electrode is next made on the n-type $Al_{0.06}Ga_{0.94}N$ contact layer 8 by lithography, and a Ti/Pt/Au film, for example, is formed on the entire surface by vacuum evaporation, for example. After that, the resist pattern is removed together with the overlying Ti/Pt/Au film by lift-off. As a result, the gate electrode 9 is formed on the n-type $Al_{0.06}Ga_{0.94}N$ contact layer 8 in Schottky contact therewith.

By these steps, an intended AlGaN/GaN HEMT is obtained as shown in FIG. 8.

According to the first embodiment, since the barrier layer between the n-type $Al_{0.15}Ga_{0.85}N$ electron supply layer 6 and the n-type $Al_{0.06}Ga_{0.94}N$ contact layer 8 is the graded undoped $Al_zGa_{1-z}N$ barrier layer 7 in which the Al composition z decreases continuously from 0.15 to 0.06 from the n-type $Al_{0.15}Ga_{0.85}N$ electron supply layer 6 toward the n-type $Al_{0.06}Ga_{0.94}N$ contact layer 8, the bottom energy of the conduction band of the graded undoped $Al_zGa_{1-z}N$ barrier layer 7 decreases continuously linearly from the n-type $Al_{0.15}Ga_{0.85}N$ electron supply layer 6 toward the n-type $Al_{0.06}Ga_{0.94}N$ contact layer 8, and coincides with the bottom energy of conduction band of the n-type $Al_{0.06}Ga_{0.94}N$ contact layer 8 at the heterointerface between the graded undoped $Al_zGa_{1-z}N$ barrier layer 7 and the n-type $Al_{0.06}Ga_{0.94}N$ contact layer 8. Therefore, there is no offset $\Delta E_c$ in conduction band along the heterointerface between the graded undoped $Al_zGa_{1-z}N$ barrier layer 7 and the n-type $Al_{0.06}Ga_{0.94}$ contact layer 8, and there is no barrier against electrons by the offset $\Delta E_c$. There is only a small barrier along the interface between the source electrode 10 and the n-type $Al_{0.06}Ga_{0.94}N$ layer 8. Therefore, the factor disturbing movement of electrons from the source electrode 10 to the undoped GaN channel layer 4, i.e. the current flow from the undoped GaN channel layer 4 to the source electrode 10 is removed, and the source resistance can be decreased significantly. As a result, the rightful performance of AlGaN HEMT can be brought out, and the transconductance $g_m$ can be increased greatly as compared with conventional technologies to realize a large current drive ability. Additionally, since a sufficiently high Schottky barrier is made between the gate electrode 9 and the n-type $Al_{0.06}Ga_{0.94}N$ contact layer 8, a sufficintly high gate resistivity to voltage is ensured.

That is, since the source resistance is largely decreased while maintaining a sufficiently high gate resistivity to voltage, and the thickness of the undoped GaN channel layer 4 is as small as 10 nm, a high-output, high-performance AlGaN/GaN HEMT can be realized.

Moreover, the AlGaN/GaN HEMT can be fabricated easily at an economical cost by basically using conventional technologies.

Figure 9:
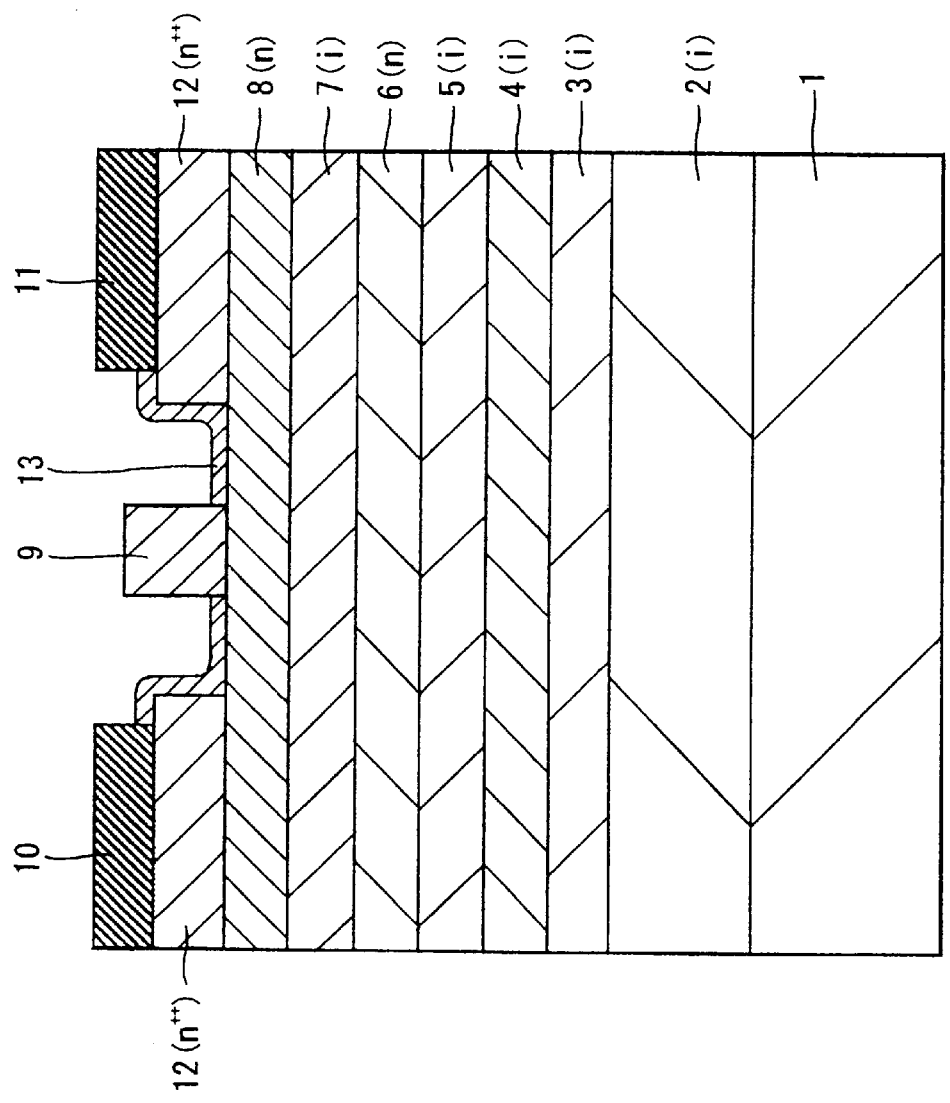
FIG. 9 is a cross-sectional view of an AlGaN/GaN HEMT according to a second embodiment of the invention.

Next explained is another AlGaN/GaN HEMT according to the second embodiment of the invention. FIG. 9 shows the AlGaN/GaN HEMT according to the second embodiment.

As shown in FIG. 9, in the AlGaN/GaN HEMT according to the second embodiment, an $n^{++}$-type GaN contact layer 12 is stacked on the $Al_{0.06}Ga_{0.94}N$ contact layer 8 in the region of the source electrode and the drain electrode, and the source electrode 10 and the drain electrode 11 are formed on the $n^{++}$-type GaN contact layer 12. The $n^{++}$-type GaN contact layer 12 may be 0.2 $\mu$m thick, for example, and its carrier concentration is $2\times10^{19}cm^{-3}$, for example. Surfaces of portions extending from the gate electrode 9 to the source electrode 10 and to the drain electrode 11 are covered by a $SiO_2$ film 13, for example. In the other respect, the second embodiment is the same as the first embodiment, and further explanation is omitted here.

A method for fabricating the AlGaN/GaN HEMT according to the second embodiment having the above-explained structure is explained below.

In the same manner as the first embodiment, first stacked on the c-face sapphire substrate 1 are a AlN or GaN buffer layer (not shown), undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6, graded undoped $Al_zGa_{1-z}N$ barrier layer 7, n-type $Al_{0.06}Ga_{0.94}N$ contact layer 8, and n -type GaN contact layer 12 by MOCVD. These layers are patterned into a mesa-type configuration for isolation.

After that, the surface of the $n^{++}$-type GaN contact layer 12 in the region for the source electrode and the drain electrode is masked with a $SiO_2$ film (not shown), for example. Then, the product is thermochemically etched at 700° C. for 35 minutes by using an etching gas which may be a mixed gas of HCl and $N_2$ containing HCl by 10%. By the thermochemical etching under these conditions, the n++-type GaN contact layer 12 is removed by approximately 0.3 $\mu$m by etching for 30 minutes, but the n-type $Al_{0.06}Ga_{0.94}N$ contact layer 8 having the Al composition as small as 0.06 is not etched at all. Therefore, by the thermochemical etching made here, the n-type $Al_{0.06}Ga_{0.94}N$ contact layer 8 fully remains non-etched, although the $n^{++}$-type GaN contact layer 12 is fully removed in the region for making the gate electrode.

Thereafter, an $SiO_2$ film 13 is formed on the entire surface by CVD, for example. Then, a resist pattern (not shown) with a predetermined configuration for making the source electrode and the drain electrode is formed on the $SiO_2$ film 13 by lithography. Using the resist pattern as a mask, the $SiO_2$ film 13 is removed by etching to expose the surface of the $n^{++}$-type GaN contact layer 12 in the region for making the source electrode and the drain electrode. After that, a Ti/Al/Au film (not shown), for example, is formed on the entire surface by vacuum evaporation, for example. The resist pattern is thereafter removed together with the overlying Ti/Al/Au film by lift-off. As a result, the source electrode 10 and the drain electrode 11 are formed on the $n^{++}$-type GaN contact layer 12. After that, the product is annealed using, for example, $N_2$ atmosphere, 850° C., for five minutes, for example, to decrease the contact resistance of the source electrode 10 and the drain electrode 11.

Another resist pattern (not shown) having a predetermined configuration for making the gate electrode is next formed on the $SiO_2$ film 13 by lithography. Using the resist pattern as a mask, the $SiO_2$ film 13 is removed by etching to expose the surface of the n-type $Al_{0.06}Ga_{0.94}N$ contact layer 8 in the region for the gate electrode. After that, a Ti/Pt/Au film (not shown), for example, is formed on the entire surface by vacuum evaporation, for example. Then, the resist pattern is removed together with the overlying Ti/Pt/Au film by lift-off. Thus, the gate electrode 9 is formed on the n-type $Al_{0.06}Ga_{0.94}N$ contact layer 8.

By these steps, the intended AlGaN/GaN HEMT is obtained as shown in FIG. 9.

According to the second embodiment, since the $n^{++}$-type GaN contact layer 12 is stacked on the n-type $Al_{0.06}Ga_{0.94}N$ contact layer 8 only in the region for making the source electrode and the drain electrode, and the source electrode 10 and the drain electrode 11 are formed on the $n^{++}$-type GaN contact layer 12, the barrier against electrons just under the source electrode 10 can be made small. As a result, the source resistance is decreased more, and a higher performance of the AlGaN/GaN HEMT is realized.

Figure 10:
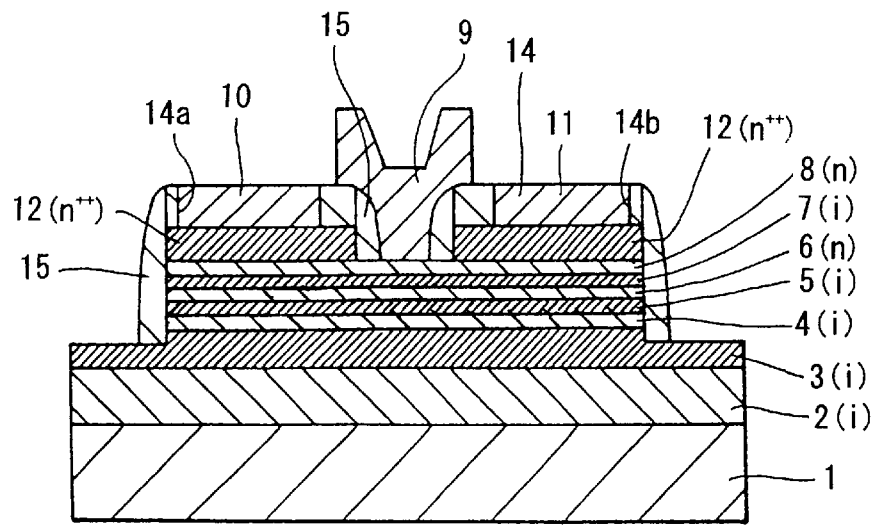
FIG. 10 is a cross-sectional view of an AlGaN/GaN HEMT according to a third embodiment of the invention.

Another AlGaN/GaN HEMT according to the third embodiment is explained below. FIG. 10 shows the AlGaN/GaN HEMT according to the third embodiment.

As shown in FIG. 10, similarly to the AlGaN/GaN HEMT according to the second embodiment, in the AlGaN/GaN HEMT according to the third embodiment, sequentially stacked on the c-face sapphire substrate 1 via an AlN or GaN buffer layer (not shown) by low temperature growth are the undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6, graded undoped $Al_zGa_{1-z}N$ barrier layer 7 and n-type $Al_{0.06}Ga_{0.94}N$ contact layer 8, and an $n^{++}$-type GaN contact layer 12 is stacked on the n-type $Al_{0.06}Ga_{0.94}N$ contact layer 8 in the region for the source electrode and the drain electrode. Thicknesses and carrier concentrations of these layers are the same as those explained with the first and second embodiments.

Provided on the $n^{++}$-type GaN contact layer 12 is a $SiO_2$ film 14. The $SiO_2$ film 14 is 0.4 $\mu$m thick, for example. The $SiO_2$ film 14 has formed openings 14a, 14b through which the source electrode 10 and the drain electrode 11 are formed on the $n^{++}$-type GaN contact layer 12. On inner side walls of the $n^{++}$-type GaN contact layer 12 and the $SiO_2$ film 14, a sidewall spacer 15 made of $SiO_2$, for example, is formed. The sidewall spacer 15 extends onto the outer sidewalls of the upper-lying part of the undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6, graded undoped $Al_zGa_{1-z}N$ barrier layer 7, n-type $Al_{0.06}Ga_{0.94}N$ contact layer 8, and $n^{++}$-type GaN contact layer 12 which are patterned into a mesa-type configuration.

In this case, the gate electrode 9 is formed in self alignment with the sidewall spacer 15 on the n-type $Al_{0.06}Ga_{0.94}N$ contact layer 8 in the location between portions of the sidewall spacer 15 on the inner sidewalls of the $n^{++}$-type GaN contact layer 12 and the $SiO_2$ film 14.

A process for fabricating the AlGaN/GaN HEMT according to the third embodiment is explained below.

Figure 11:
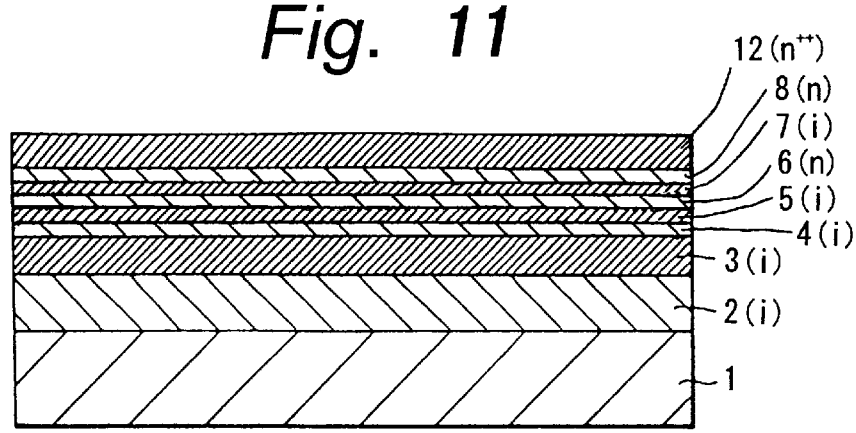
FIG. 11 is a cross-sectional view for explaining a method for manufacturing the AlGaN/GaN HEMT according to the third embodiment of the invention.

As shown in FIG. 11, similarly to the first embodiment, first stacked sequentially on the c-face sapphire substrate 1 are the AlN or GaN buffer layer (not shown), undoped GaN layer 2, undoped $Al_{0.3}Ga_{0.7}N$ layer 3, undoped GaN channel layer 4, undoped $Al_{0.15}Ga_{0.85}N$ spacer layer 5, n-type $Al_{0.15}Ga_{0.85}N$ electron supply layer 6, graded undoped $Al_zGa_{1-z}N$ barrier layer 7 and n-type $Al_{0.06}Ga_{0.94}N$ contact layer 8, and $n^{++}$-type GaN contact layer 12 by MOCVD.

Figure 12:
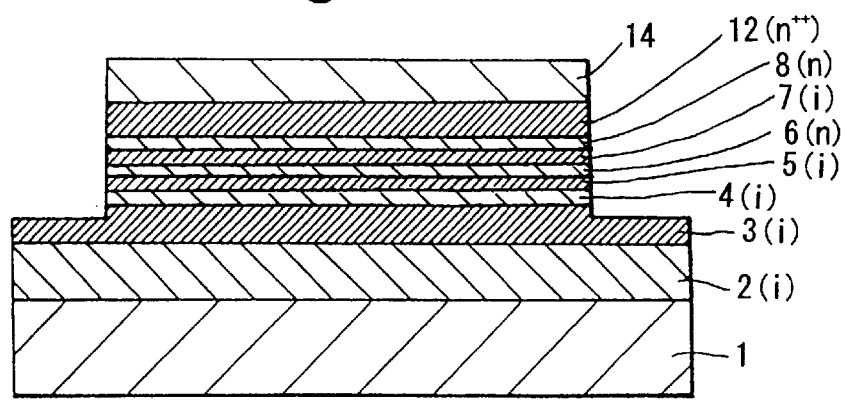
FIG. 12 is a cross-sectional view for explaining a method for manufacturing the AlGaN/GaN HEMT according to the third embodiment of the invention.

Next, as shown in FIG. 12, the $SiO_2$ film 14 with the thickness of 0.4 $\mu$m, for example, is formed on the entire surface of the $n^{++}$-type GaN contact layer 12 by CVD, for example, and it is patterned into a predetermined configuration by lithography and etching. Used for etching the $SiO_2$ film 14 is, for example, wet etching using a fluoric etchant or RIE using a fluoric etching gas.

Next using the $SiO_2$ film 14 as a mask, the layers are etched until reaching the undoped $Al_{0.3}Ga_{0.7}N$ layer 3 by RIE, for example.

Figure 13:
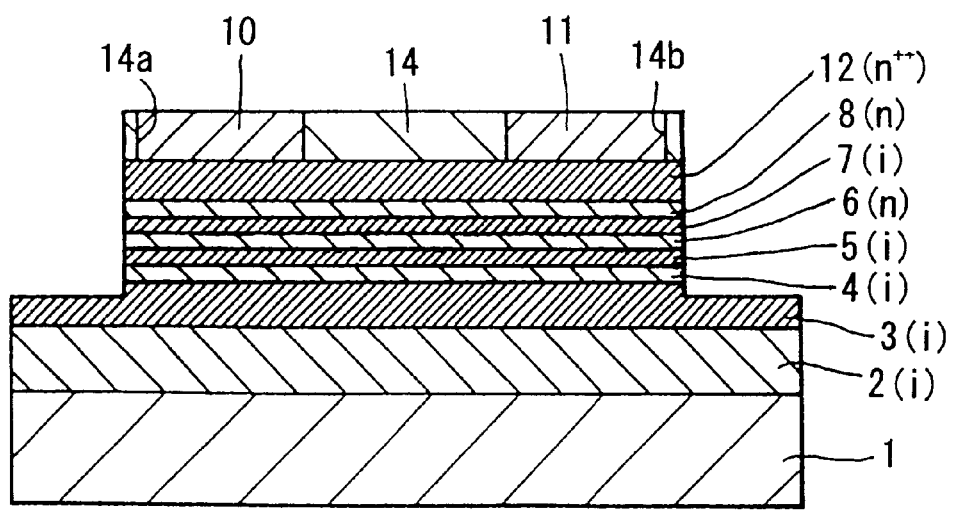
FIG. 13 is a cross-sectional view for explaining a method for manufacturing the AlGaN/GaN HEMT according to the third embodiment of the invention.

Next with reference to FIG. 13, a resist pattern (not shown) with a predetermined configuration for making the source electrode and the drain electrode is formed by lithography. Using the resist pattern as a mask, the $SiO_2$ film 14 is etched to form the openings 14a, 14b, and a Ti/Al/Au film (not shown) is formed on the entire surface by vacuum evaporation, for example. The resist pattern is thereafter removed togther with the overlying Ti/Al/Au film by lift-off. As a result, the source electrode 10 and the drain electrode 11 are formed on the $n^{++}$-type GaN contact layer 12 in locations of the opening 14a and 14b. After that, the product is annealed using, for example, $N_2$ atmosphere, 850° C., for 5 minutes, to decrease the contact resistance of the source electrode 10 and the drain electrode 11.

Figure 14:
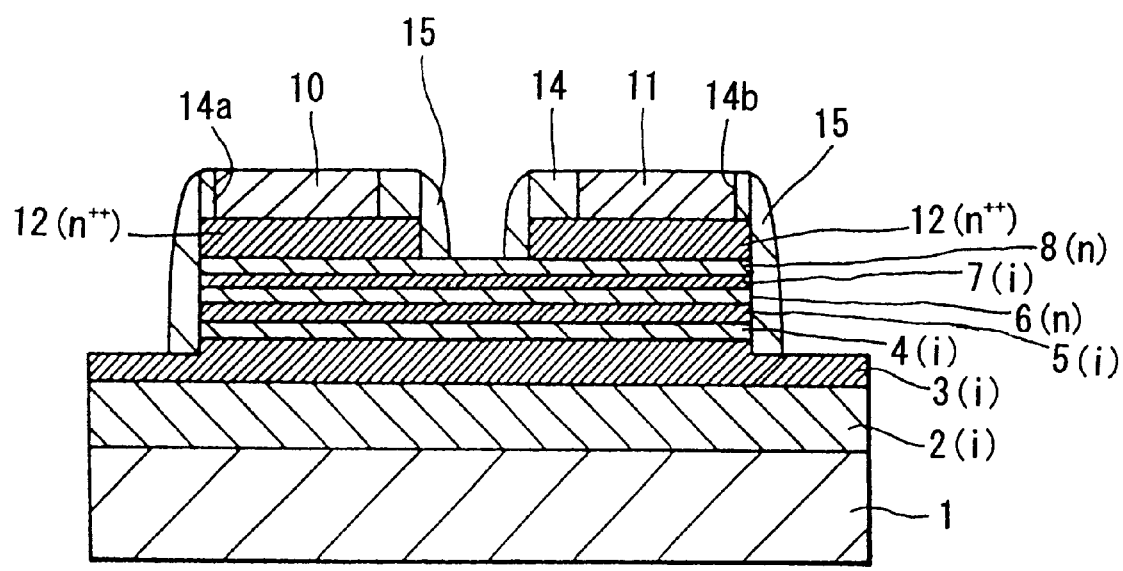
FIG. 14 is a cross-sectional view for explaining a method for manufacturing the AlGaN/GaN HEMT according to the third embodiment of the invention.

As shown in FIG. 14, the $SiO_2$ film 14 is selectively removed in the region for the gate electrode by lithography or etching, and thermochemical etching is done using an etching gas which may be a mixed gas of HCl and $N_2$ containing HCl by 10%. By the thermochemical etching the $n^{++}$-type GaN contact layer 12 is fully removed in the region for the gate electrode, but the n-type $Al_{0.06}Ga_{0.94}N$ contact layer 8 fully remains non-etched.

After that, a $SiO_2$ film with the thickness of 0.3 $\mu$m, for example, is formed on the entire surface by CVD, for example, and it is etched back by RIE. As a result, the sidewall spacer 15 made of $SiO_2$ is formed on the sidewalls of the $n^{++}$-type GaN contact layer 12 and the $SiO_2$ film 14 in the region for the gate electrode.

A resist pattern (not shown) with a predetermined configuration for making the gate electrode is next formed by lithography, and a Ti/Au film, for example, is formed on the entire surface by vacuum evaporation, for example. The resist pattern is thereafter removed together with the Ti/Au film by lift-off. As a result, the gate electrode 9 is formed on the n-type $Al_{0.06}Ga_{0.94}N$ contact layer 8 in Schottky contact therewith as shown in FIG. 10.

By these steps, the intended AlGaN/GaN HEMT as shown in FIG. 10 is obtained.

According to the third embodiment, the following additional advantages are obtained in addition to the same advantages as those of the first and second embodiments. Namely, since the gate electrode 9 is formed in a location between portions of the sidewall spacer 15 on inner sidewalls of the n type GaN contact layer 12 and the $SiO_2$ film 14, the gate electrode 9 is located closer to the source electrode 10. Therefore, the whole source resistance can be reduced, and the gate length can be reduced down to a size as small as twice the thickness of the sidewall spacer 15, beyond the patterning limit by etching. On the other hand, the upper portion of the gate electrode 9 can be made sufficiently large to greatly reduce the gate resistance. As a result, a remarkably high-performance AlGaN/GaN HEMT of a recess gate structure can be realized.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims. For example, the numerical values, structures, materials, source materials, growth methods, and so on, indicated in explanations of the first, second and third embodiments are only examples, and any other appropriate numerical values, structures, materials, source materials, growth methods, etc. may be employed.

More specifically, in the second embodiment, for example, since the source electrode 10 and the drain electrode are formed on the $n^{++}$-type GaN contact layer 12 with a sufficiently high carrier concentration, and the n-type $Al_{0.06}Ga_{0.94}N$ contact layer 8 is not essentially necessary for the gate electrode 9, the n-type $Al_{0.06}Ga_{0.94}N$ contact layer 8 may be omitted.

As described above, according to the heterojunction field effect transistor according to the invention, since the bottom energy of the conduction band of the barrier layer directly under the source electrode decreases continuously from the electron supply layer toward the contact layer, a high performance can be realized by significantly reducing the source resistance while maintaining the gate resistivity to voltage sufficiently high.

What is claimed is:

1. A heterojunction field effect transistor comprising:
   an electron moving layer;
   an electron supply layer on said electron moving layer;
   a barrier layer on said electron supply layer; and
   a contact layer on said barrier layer, a source electrode on said contact layer, wherein the bottom energy of the conduction band of said barrier layer immediately under said source electrode being decreased continuously from said electron supply layer toward said contact layer.

2. The heterojunction field effect transistor according to claim 1 wherein the bottom energy of the conduction band of said barrier layer is approximately equal to the bottom energy of the conduction band of said contact layer along the interface between said barrier layer and said contact layer.

3. The heterojunction field effect transistor according to claim 1 wherein the energy gap of said barrier layer immediately under said source electrode continuously decreases from said electron supply layer toward said contact layer.

4. The heterojunction field effect transistor according to claim 1 wherein the composition of said barrier layer continuously varies from said electron supply layer toward said contact layer to continuously decreases the bottom energy of the conduction band of said barrier layer from said electron supply layer toward said contact layer.

5. The heterojunction field effect transistor according to claim 1 wherein said barrier layer is undoped.

6. The heterojunction field effect transistor according to claim 1 wherein said contact layer is n-type.

7. The heterojunction field effect transistor according to claim 1 wherein said electron moving layer is made of $Ga_{1-x}In_xN$ (where $0 \leq x \leq 1$), said electron supply layer is made of $Al_yGa_{1-y}N$ (where $0 \leq y \leq 1$), said barrier layer is made of $Al_zGa_{1-z}N$, and said contact layer is made of n-type $Al_uGa_{1-u}N$ (where $0 \leq u \leq 0.1$) or n-type $Ga_{1-v}In_vN$ (where $0 \leq v \leq 1$).

8. The heterojunction field effect transistor according to claim 7 wherein the Al composition z in said $Al_zGa_{1-z}N$ forming said barrier layer continuously decreases from y to u from said electron supply layer toward said contact layer.

9. The heterojunction field effect transistor according to claim 7 wherein the Al composition z in said $Al_zGa_{1-z}N$ forming said barrier layer is not less than 0.1 along the interface between said barrier layer and said contact layer.

* * * * *

UNITED STATES PATENT AND TRADEMARK OFFICE
CERTIFICATE OF CORRECTION

PATENT NO. : 6,064,082
DATED : May 16, 2000
INVENTOR(S) : Hiroji Kawai et al.

It is certified that error appears in the above-identified patent and that said Letters Patent is hereby corrected as shown below:

Column 13,
Line 5, delete "and".
Line 6, after "layer," insert -- and -- and start a new paragraph with "a source electrode".
Line 7, start new paragraph with "wherein" and another new paragraph with "the bottom energy".

Signed and Sealed this

Eighth Day of April, 2003

JAMES E. ROGAN
*Director of the United States Patent and Trademark Office*